United States Patent [19]
Schraivogel et al.

[11] Patent Number: 5,877,833
[45] Date of Patent: Mar. 2, 1999

[54] INTERCONNECTION STRUCTURE WITH RAISED PERIMETER PORTIONS

[75] Inventors: Rainer A. Schraivogel, Wettingen; Guido Plangger, Zürich, both of Switzerland

[73] Assignee: U.S. Philips Corporation, New York, N.Y.

[21] Appl. No.: 757,085

[22] Filed: Sep. 10, 1991

[30] Foreign Application Priority Data

Sep. 10, 1990 [NL] Netherlands ............................ 9001982

[51] Int. Cl.$^6$ ...................................................... G02F 1/33
[52] U.S. Cl. ............................ 349/149; 257/81; 257/735; 257/778
[58] Field of Search ................................ 359/88; 257/81, 257/99, 735, 737, 778, 780, 781, 786; 349/257, 749

[56] References Cited

U.S. PATENT DOCUMENTS 4,826,297  5/1989  Kubo et al. ................................ 359/88

FOREIGN PATENT DOCUMENTS

| 0303256 | 2/1989 | European Pat. Off. . |
| 0352020 | 1/1990 | European Pat. Off. . |
| 0152972 | 11/1990 | European Pat. Off. . |
| 61172362 | 2/1986 | Japan . |
| 1098237 | 4/1989 | Japan . |

OTHER PUBLICATIONS

Toute L'Electronique, No. 534, May 1988, Paris, Fr. pp.18–23; Y. Linuma et al "Techniques Des Ecrans & Cristaux Liquides".

Primary Examiner—William L. Sikes
Assistant Examiner—Kenneth Parker
Attorney, Agent, or Firm—Norman N. Spain

[57] ABSTRACT

By providing an interconnection structure (1) with strip-shaped elevations (11) which, in a plan view, are preferably asterisk-shaped, the contact face is cleaned during compression and an adhesive can easily flow away. The interconnection structure is very suitable for face-down bonding of drive ICs in a display device.

22 Claims, 2 Drawing Sheets

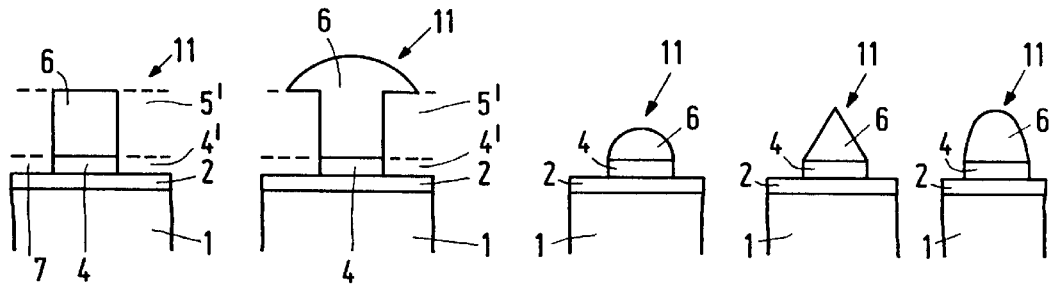
FIG.3a  FIG.3b  FIG.3c  FIG.3d  FIG.3e
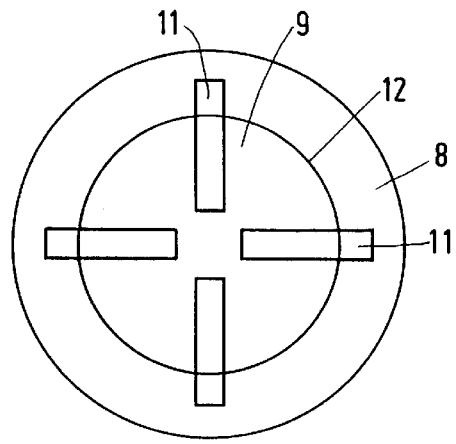 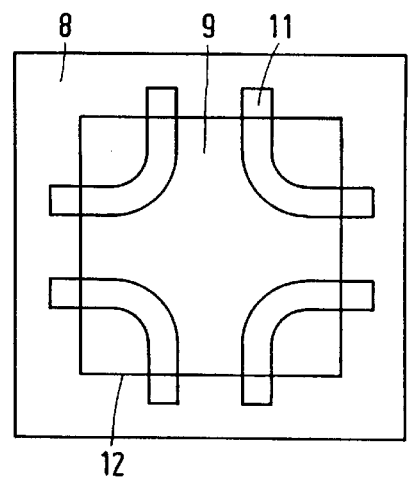
FIG.4a  FIG.4b
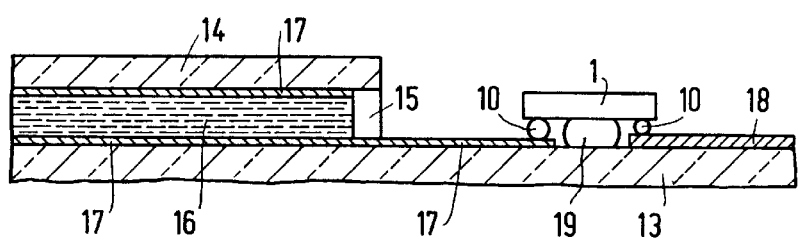
FIG.5

INTERCONNECTION STRUCTURE WITH RAISED PERIMETER PORTIONS

BACKGROUND OF THE INVENTION

The invention relates to an interconnection structure for connecting a conductor pattern associated with a substrate in an electrically conducting manner.

The relevant conductor pattern may form part of, for example, a semiconductor substrate (integrated circuit or a discrete semiconducotr element) or of a wiring pattern of, for example, glass, quartz, ceramic material, polyimide or other synthetic.

The invention also relates to a display device in which such an interconnection structure is used.

An interconnection structure of the type described in the opening paragraph, also referred to as a "bump", may be provided on a semiconductor substrate for mounting by means of the so-called flip-chip method (also referred to as face-down bonding). Such a structure is described in U.S. Pat. No. 4,749,120. An IC provided with such bumps is mounted on a glass substrate by means of said flip-chip method. In one of the mounting methods described in U.S. Pat. No. 4,749,120 an electrically conducting contact is first obtained between the bump and the conductor track by means of a pressure contact, whereafter the pressure of this contact is maintained by curing a resin layer provided between the substrate and the IC.

Such a mounting method is used, inter alia, in the manufacture of liquid crystal display devices (LCDs) in which ICs are secured by means of said flip-chip method on a substrate of glass or quartz which also forms part of the actual (liquid crystal) display device. Conductor tracks continuing as far as the actual display section are provided with drive voltages via the integrated circuits which contact these conductor tracks by means of said interconnection structures (or bumps).

However, a number of problems may occur. A first problem occurs, for example, when contacting integrated circuits with many bumps, where different types of conductor tracks are present on the substrate, for example, indium tin oxide tracks for driving pixels in addition to, for example, aluminium tracks. A possible difference in thickness between the different types of conductor tracks may give rise to poor or open contacts, notably in the case of pressure contacts.

Moreover, if no special measures are taken, the actual contact of the interconnection structure with, for example, a thin connection conductor may remain limited to a very small area (for example, a projecting point of the bump), which leads to a high contact resistance. This notably occurs when a low pressure is used for contacting, for example, for test purposes. Such high contact resistances may subsist also after mounting.

OBJECTS AND SUMMARY OF THE INVENTION

The present invention has for its object to eliminate the above-mentioned drawbacks as much as possible.

It is based, inter alia, on the recognition that the contact resistance is decreased and that simultaneously the reliability of the interconnection structure can be enhanced by giving it a special profile.

To this end an interconnection structure according to the invention is characterized in that the interconnection pattern has patterned, strip-shaped elevations on at least a part of its central surface area, said elevations having a length which is at least 4 times the width.

The elevations may continue as far as proximate to the edge of the interconnection structure where they may be raised with respect to the central part.

"At least a part of its central surface area" is herein understood to mean that the elevations are not exclusively present along the (entire) circumference, as described in U.S. patent application Ser. No. 554,633 in the name of the Applicant. The fact that the elevations are patterned and are not exclusively situated at the circumference considerably enhances the possibility that the thermosetting resin (or another adhesive) used flows away under the bump during compression.

Since the length of the elevations is at least 4 times the width, such a construction leads to good contacts because the strips can become wider towards two sides when pressure is exerted on them during compression and due to this displacement the surface area of the contact faces is cleaned, as it were. When the height of the bump is reduced by 50%, the width of these strips increases by a factor of 2, whereas the radius increases only by a factor of $\sqrt{2}$ when using circular bumps. Due to the larger lateral displacement, superfluous adhesive is squeezed out better.

The elevations are preferably raised at the area of the circumference. An advantage of raised portions of the elevations along the circumference (with respect to parts in the central portion) is that satisfactory electric contacts are obtained at the area of the circumference so that said current concentration at one point is avoided. This advantage is notably achieved if the interconnection structure, in a plan view, is circular or octagonal, but good results are also achieved with regular or irregular polygons. The interconnection structure may also be, for example, star-shaped in a plan view. The elevations are preferably star-shaped or asterisk-shaped, so that test pins for testing an integrated circuit make a satisfactory contact (without a high series resistance) while these elevations satisfactorily withstand the plastic deformation. Moreover, they generally cover an area which is smaller than the tip of the test pin so that the underlying metal is not damaged. Possible damages by a test pin only cover a portion of the interconnection structure, the total surface area of which is much larger than the surface area of a test pin.

The maximum height of an elevation, viewed in a cross-section, is preferably 5 $\mu$m.

The interconnection structure can be manufactured by means of conventional galvanic structures, so that the extra steps described in the U.S. patent applications Ser. No. 496,394 or 554,633 in the name of the Applicant are not absolutely necessary.

The interconnection structure according to the invention is particularly suitable for substrates having connections arranged in a plurality of rows, as described in the U.S. patent application Ser. No. 496,477 in the name of the Applicant.

The interconnection structure is notably advantageous in a display device in which connection electrodes extending beyond the dislay device on a (glass) supporting body are contacted, for example, with an integrated circuit for drive purposes.

BRIEF DESCRIPTION OF THE DRAWINGS

The invention will now be described in greater detail with reference to an embodiment and the accompanying drawings in which

FIGS. 3(a)–(e) are diagrammatic cross-sections taken on the line III—III in FIG. 1;

FIGS. 4(a) and (b) are views similar to FIG. 1 showing additional embodiments of the structure; and FIG. 5 is a diagrammatic cross-section of a device in which interconnection structures according to the invention are used.

DESCRIPTION OF THE PREFERRED EMBODIMENTS

Figure 1:
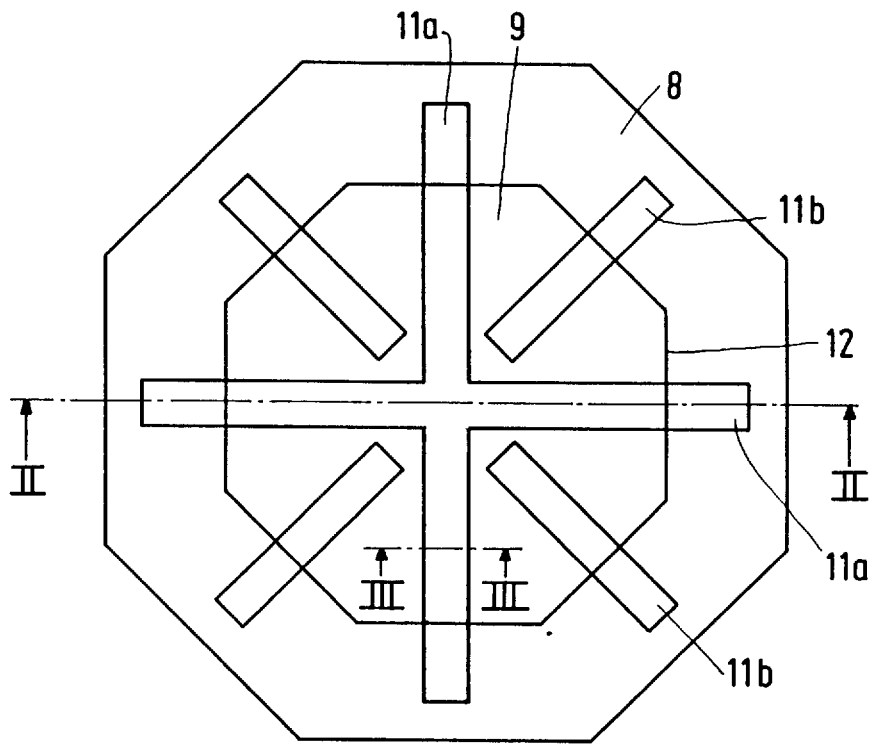
FIG. 1 is a diagrammatic plan view of an interconnection structure according to the invention.
Figure 2:
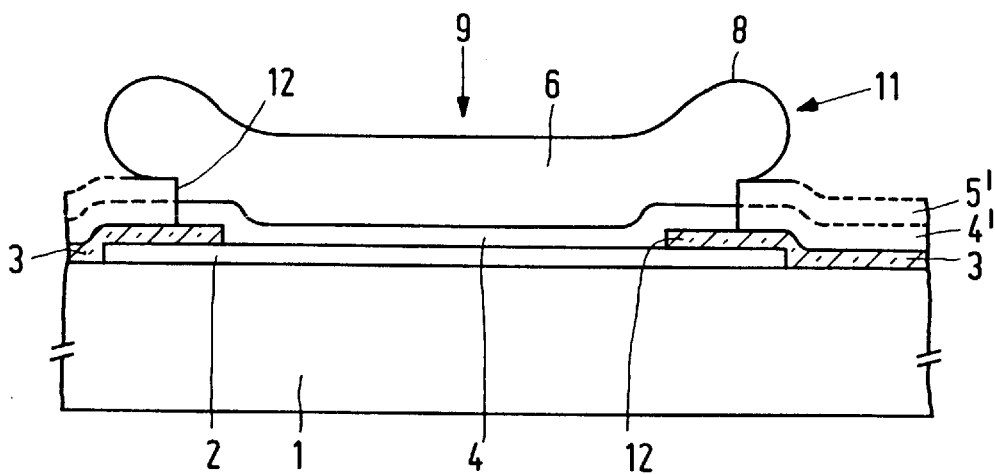
FIG. 2 is a diagrammatic cross-section taken on the line II—II in FIG. 1.

The interconnection structure (bump) 10 of FIGS. 1, 2 is present on a substrate 1, in this example an integrated circuit formed in silicon. The wiring pattern of the integrated circuit comprises, inter alia, bonding pads 2 for contacting the circuit. The silicon substrate 1 has a passivating layer 3 of silicon oxide, silicon nitride or a combination thereof, which covers the entire surface area of the substrate 1, with the exception of the central area of bonding pads 2. The passivating layer 3 has a thickness of approximately 1 μm and at the area of the bonding pads 2 it is provided with windows 12 having a slightly smaller surface area then that of the bonding pads. In this example the bonding pads 2 are octagonal and have a diameter of approximately 70 μm, while the windows 12 have a diameter of approximately 60 μm.

The interconnection pattern has a double layer which comprises a first layer 4 of aluminium and a second layer 6 of gold with a total thickness of approximately 3 μm in this example. The thickness of the layer 4 is approximately 1 μm. In this embodiment the layers 4, 6 form part of an asterisk-shaped assembly of elevations 11.

The interconnection structure (bump) 10 described above can be manufactured as follows.

The method starts from a substrate 1 comprising an (integrated) circuit or another circuit element having bonding pads 2 and being coated with a passivating layer having windows 12 at the area of the bonding pads. Firstly, a layer of aluminium 4, 4' with a thickness of 1 μm is deposited on the whole assembly, which layer is used as a short-circuit layer at a later stage for obtaining the further structure by electrodeposition. The layer 4 may have an anti-diffusion coating (not shown) to prevent gold from diffusing into the aluminium if gold is used for the layer 6.

Subsequently, a mask 5 of a photoresist is provided photolithographically, which defines the areas where electrodeposition can take place. This layer has a thickness of, for example 2 μm, while the apertures in the mask 5 constitute an asterisk-shaped pattern in this embodiment.

During electrodeposition a metal layer (gold in this example) is deposited to a thickness of approximately 4 μm at a low electrodeposition current and at a temperature of approximately 45° C. The layer thus obtained is in compliance with the underlying profile, is substantially smooth and extends to some extent beyond the edges of the mask 5.

The resulting structure has the following advantages. Since the elevations extending towards the edges 8 are more and more spaced apart, superfluous adhesive or resin is squeezed from below the structure when a conductor structure connection is established via compression. Simultaneously, the surface area to be contacted is cleaned, as it were. The ultimate compression of the bump is therefore exclusively defined by plastic properties of the bump material.

As a result of this and of the strip-shaped structure, a maximum lateral widening of the bump is possible, leading to a maximum contact surface area and an optimum cleaning.

Moreover, the strip-shaped elevations 11 can be tested by means of a probe without damaging the underlying contact surface area 2.

Since the elevations 11 are raised at the area of the edges 8 which surround central portion 9, the smallest risk of poor cleaning and hence poor contacts exists at that area. This prevents electric currents from flowing substantially through one point in the finished product. The elevations 11 have, for example, a width of 4 μm and a height of 4 μm (FIG. 3a). The length of the elevations 11a is approximately 70 μm and that of the elevations 11b is approximately 20 μm. These elevations are preferably square or rectangular, as viewed in a cross-section, but they may also be mushroom-shaped (FIG. 3b) or semi-circular, pointed, or have another shape (FIG. 3c . . . FIG. 3e).

FIG. 4 shows some alternative shapes of the elevations 11. For example, they may have the shape of a cross (which is closed or not closed), as is shown in FIG. 4a, but the elevations may also be situated along curved tracks (as is shown in FIG. 4b), which tracks themselves may slightly vary in width. Instead of an uninterrupted strip or elevation, the elevation may alternatively comprise an assembly of, for example, cylindrical or mushroom-shaped elevations which are arranged, for example, in a line configuration. The interconnection structure or "bump" may also be round (FIG. 4a) or square (FIG. 4b).

FIG. 5 shows a substrate 1 with, for example, a control circuit which establishes an electrically conducting contact with conductor tracks 17, 18 on a supporting body 13 of, for example, glass (or quartz) via such interconnection structures 10 and by means of pressure contacts. Together with a sealing edge 15, the glass plate 13 and a second glass plate 14 enclose a liquid crystal material 16 and thus form a part of a liquid crystal display device. (Further components such as polarizers, lighting elements, etc. have been omitted for the sake of simplicity in FIG. 5).

To be able to drive the display device, it has connection electrodes which are formed by conductor tracks 17 of, for example, indium tin oxide which extend beyond the edge 15 in this example and are connected in an electrically conducting manner to the control circuit in the substrate 1 via interconnection structures (bumps) 10. External signals are applied to this control circuit via aluminium tracks 18 and interconnection structures (bumps) 10. A possible difference in thickness between the conductor tracks 16 and 18 (exaggerated in FIG. 5) is compensated for, because the bumps 10 can be depressed over a large part of their thickness without any influence on the electric contact. The pressure for these pressure contacts is maintained by an adhesive bond 19 in the relevant example.

The invention is of course not limited to the embodiment shown, but several variations are possible within the scope of the invention. For example, the bumps 10 may also be formed on the supporting body.

Various other applications are also possible. For example, in FIG. 5 the liquid crystal may be replaced by other electro-optical media such as electrochromic or electrophoretic materials.

More generally, the invention is applicable to chip-on-glass techniques, for example, for memories or to face-down bonding techniques on ceramic material, polyimide, etc.

Interconnection structures according to the invention may also be used advantageously in control circuits for thin display devices as described in U.S. Pat. No. 4,853,585.

We claim:

1. An interconnection structure for connecting a conductor pattern provided on a substrate in an electrically conducting manner to an additional member, characterized in that the interconnecting structure has patterned strip-shaped contact elevations on at least a part of its central surface for connecting said conductor pattern to said additional member in an electrically conducting manner, each of said strip-shaped contact elevations having a length which is at least 4 times its width and said strip-shaped elevations, at the area along the perimeter of the interconnection structure, are raised with respect to the central portion.

2. An interconnection structure as claimed in claim 1, having such a pattern of elevations that sufficient space is left for the flow of adhesives to be used during compression when the interconnection structure is pressed onto the substrate.

3. An interconnection structure as claimed in claim 2, characterized in that the substrate is a semiconductor body, glass, quartz, synthetic resin, polyimide or a ceramic material.

4. An interconnection structure as claimed in claim 2, characterized in that the maximum height of an elevation, viewed in a cross-section, is 5 $\mu$m.

5. An interconnection structure as claimed in claim 2, characterized in that, the surfaces of the elevations are substantially cross-shaped or asterisk-shaped.

6. An interconnection structure as claimed in claim 2, characterized in that, the surface of said structure is substantially circular, square, octagonal-shaped.

7. An interconnection structure as claimed in claim 1, characterized in that the maximum height of an elevation, viewed in a cross-section, is 5 $\mu$m.

8. An interconnection structure as claimed in claim 7, characterized in that the surface of said structure is substantially circular, square, octagonal-shaped.

9. An interconnection structure as claimed in claim 7, characterized in that the substrate is a semiconductor body, glass, quartz, synthetic resin, polyimide or a ceramic material.

10. An interconnection structure as claimed in claim 2, characterized in that, the surfaces of said the elevations are substantially cross-shaped or asterisk-shaped.

11. An interconnection structure as claimed in claim 1, characterized in that, the surfaces of the elevations are substantially cross-shaped or asterisk-shaped.

12. An interconnection structure as claimed in claim 11, characterized in that, the surface of said structure is substantially circular, square, octagonal-shaped.

13. An interconnection structure as claimed in claim 11, characterized in that the substrate is a semiconductor body, glass, quartz, synthetic resin, polyimide or a ceramic material.

14. An interconnection structure as claimed in claim 1 characterized in that, the surfaces of said structure is substantially circular, square, or octagonal-shaped.

15. An interconnection structure as claimed in claim 14, characterized in that the diameter of the interconnection structure is at most 100 $\mu$m.

16. An interconnection structure as claimed in claim 15, characterized in that the substrate is a semiconductor body, glass, quartz, synthetic resin, polyimide or a ceramic material.

17. An interconnection structure as claimed in claim 14, characterized in that the substrate is a semiconductor body, glass, quartz, synthetic resin, polyimide or a ceramic material.

18. An interconnection structure as claimed in claim 1, characterized in that the substrate is a semiconductor body, glass, quartz, synthetic resin, polyimide or a ceramic material.

19. A display device comprising an electro-optical medium provided between two supporting bodies provided with drive electrodes, said drive electrodes on one of the supporting bodies extending as far as beyond the surface area defined by the electro-optical medium, characterized in that the device electrodes are connected in an electrically conducting manner to a semiconductor structure by means of an interconnection structure having patterned strip-shaped contact elevations on at least a part of its central surface for contacting a conductor pattern provided on said semiconductor substrate in an electrically conductive manner, each of said strip-shaped contact elevations having a length which is at least 4 times its width and said strip-shaped elevations at the area along the perimeter of the interconnection structure are raised with respect to the central portion.

20. The display device of claim 19 wherein the interconnection structure has such a pattern of elevations that sufficient space is left for the flow of adhesives to be used during compression when the interconnection structure is pressed onto the substrate.

21. The display device of claim 19, wherein the surfaces of the elevations are substantially cross-shaped or asterisk-shaped.

22. The display device of claim 19, wherein the substrate is a semiconductor body, glass quartz, synthetic resin, polyimide or a ceramic material.

* * * * *